(12) United States Patent
Matsuno

(10) Patent No.: US 8,592,272 B2
(45) Date of Patent: Nov. 26, 2013

(54) METHOD OF MANUFACTURING NON-VOLATILE SEMICONDUCTOR MEMORY DEVICE

(75) Inventor: Koichi Matsuno, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/598,983

(22) Filed: Aug. 30, 2012

(65) Prior Publication Data

US 2013/0252388 A1   Sep. 26, 2013

(30) Foreign Application Priority Data

Mar. 21, 2012   (JP) ................. 2012-064540

(51) Int. Cl.
*H01L 21/8242* (2006.01)
(52) U.S. Cl.
USPC ........... 438/241; 438/201; 438/211; 438/218; 438/257; 438/261; 257/314; 257/315; 257/319; 257/321; 257/324; 257/E21.209
(58) Field of Classification Search
None
See application file for complete search history.

(56) References Cited

U.S. PATENT DOCUMENTS

| 7,045,413 | B2 | 5/2006 | Lee et al. |
| 7,105,431 | B2 | 9/2006 | Yin et al. |
| 7,151,684 | B2 | 12/2006 | Matsunaga et al. |
| 7,187,031 | B2 | 3/2007 | Azuma |
| 7,704,851 | B2 | 4/2010 | Kim |
| 7,915,156 | B2 | 3/2011 | Aoyama et al. |
| 2007/0257305 | A1 | 11/2007 | Sasago et al. |
| 2008/0093652 | A1 | 4/2008 | Okajima |
| 2008/0303115 | A1* | 12/2008 | Miyazaki et al. ............. 257/506 |
| 2011/0147822 | A1 | 6/2011 | Aoyama et al. |

FOREIGN PATENT DOCUMENTS

| JP | 2004-6891 | 1/2004 |
| JP | 2004-241780 | 8/2004 |
| JP | 2006-49728 | 2/2006 |
| JP | 2007-507091 | 3/2007 |
| JP | 2007-299975 | 11/2007 |
| JP | 2008-66689 | 3/2008 |
| JP | 2008-103561 | 5/2008 |
| JP | 2008-305901 | 12/2008 |
| JP | 2009-206152 | 9/2009 |

* cited by examiner

*Primary Examiner* — Kyoung Lee
(74) *Attorney, Agent, or Firm* — Oblon, Spivak, McClelland, Maier & Neustadt, L.L.P.

(57) ABSTRACT

A method of manufacturing a non-volatile semiconductor memory device of an embodiment includes: forming, on a semiconductor substrate, an element isolation region to be filled with a first insulating film; forming memory cell gate electrodes on element regions; etching the first insulating film so that the first insulating film remains in the element isolation region of a region in which a select gate electrode is to be formed; forming a second insulating film on the memory cell gate electrodes so that an air gap is created between the memory cell gate electrodes; forming two select gate electrodes; forming carbon side walls on the select gate electrodes; implanting ions of an impurity between the two select gate electrodes with the side walls as a mask; and removing the carbon side walls.

20 Claims, 17 Drawing Sheets

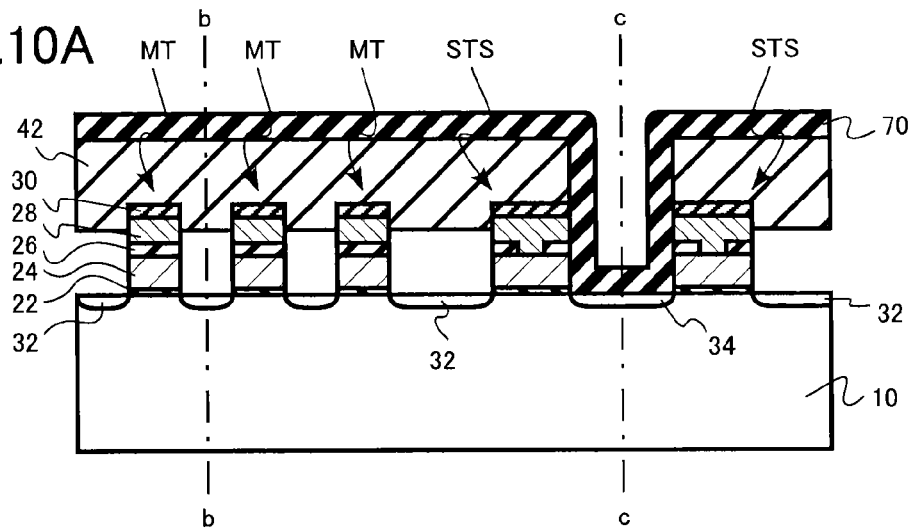
FIG.10A
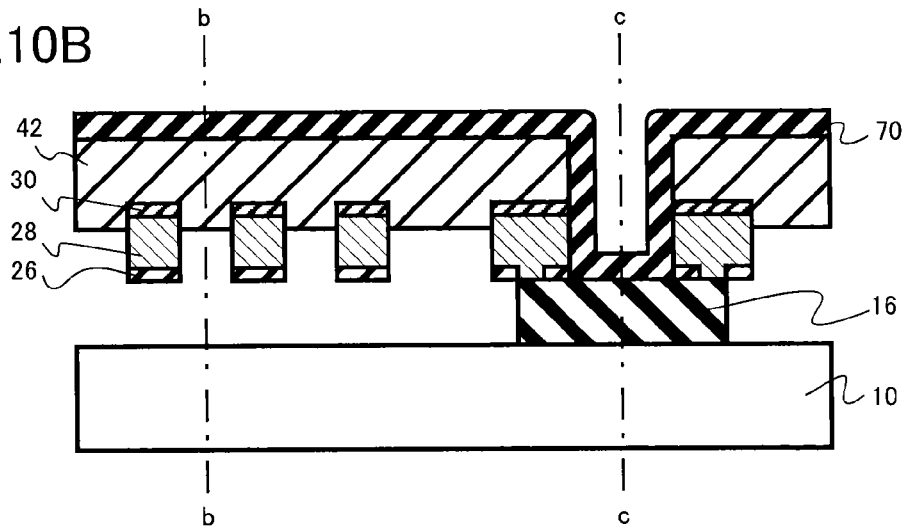
FIG.10B
FIG.10C b-b
FIG.10D c-c
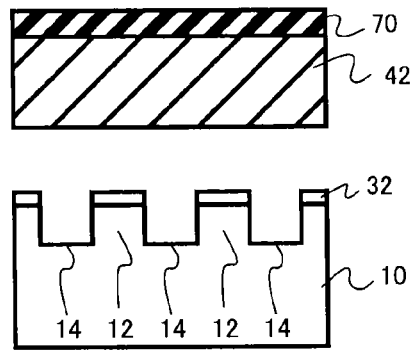
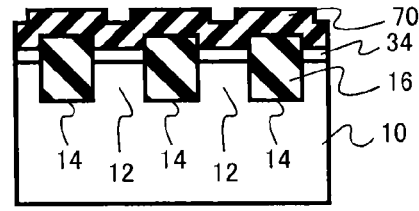

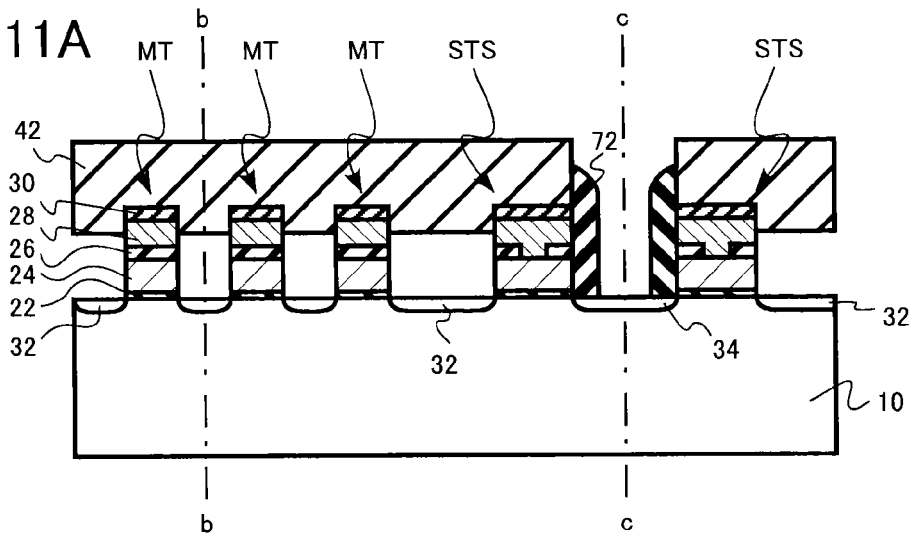
FIG.11A
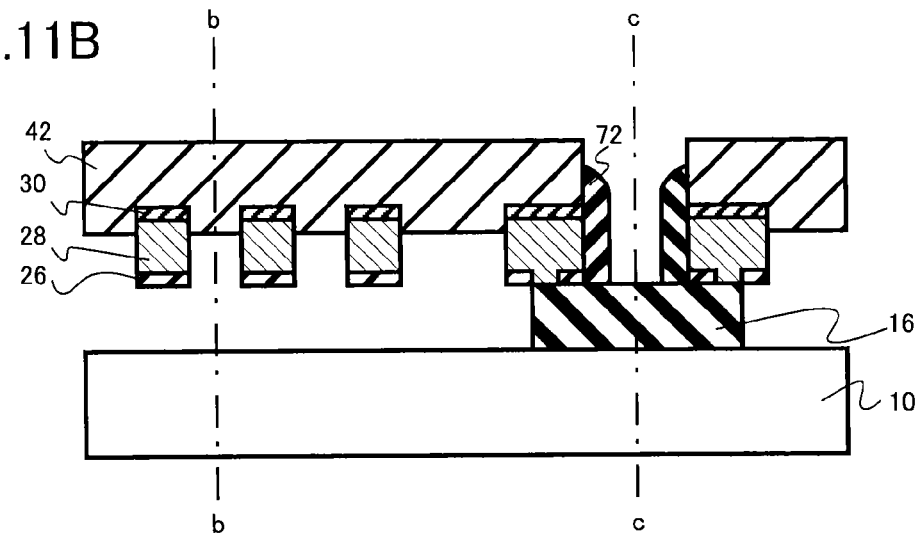
FIG.11B
FIG.11C b-b
FIG.11D c-c
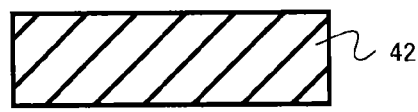
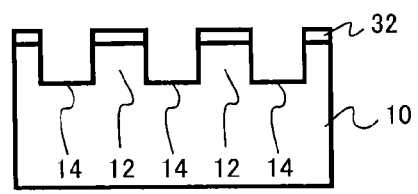
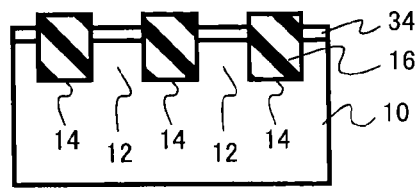

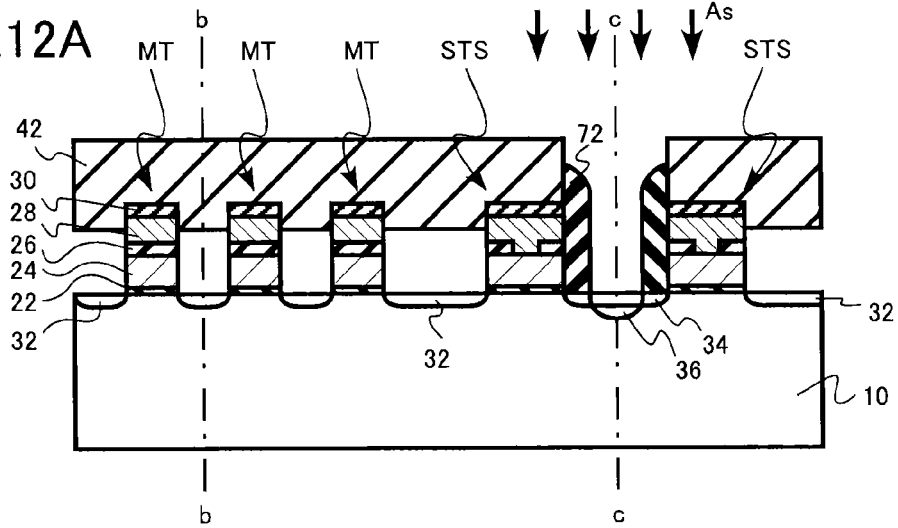
FIG.12A
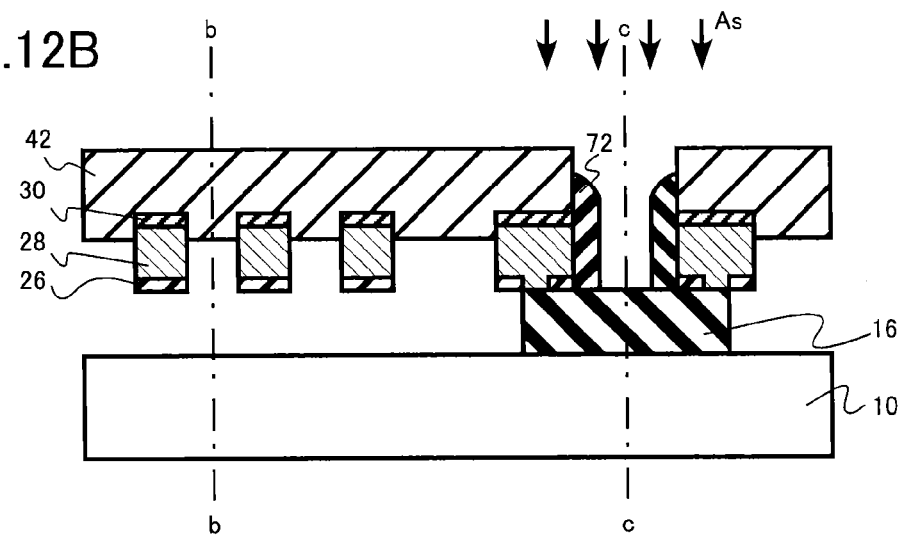
FIG.12B
FIG.12C  b-b
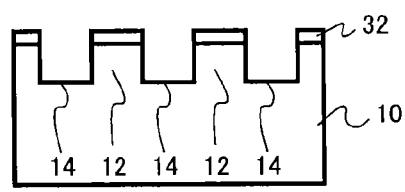
FIG.12D  c-c
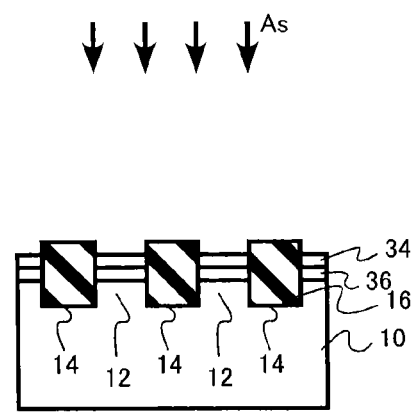

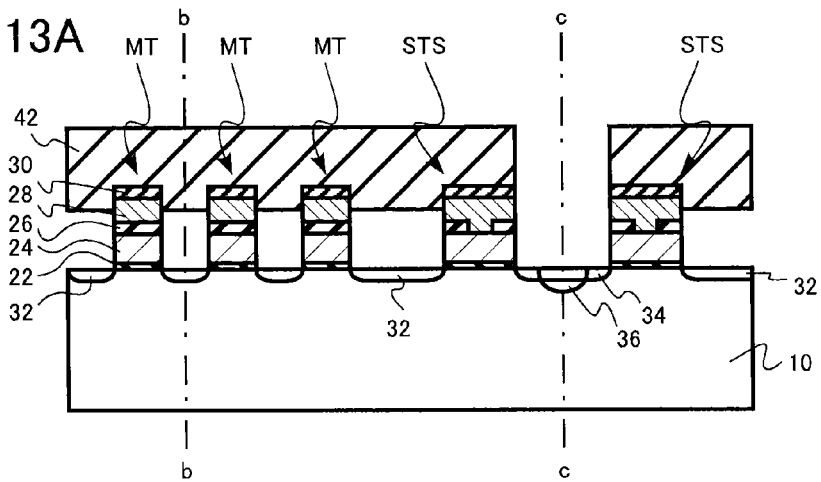
FIG.13A
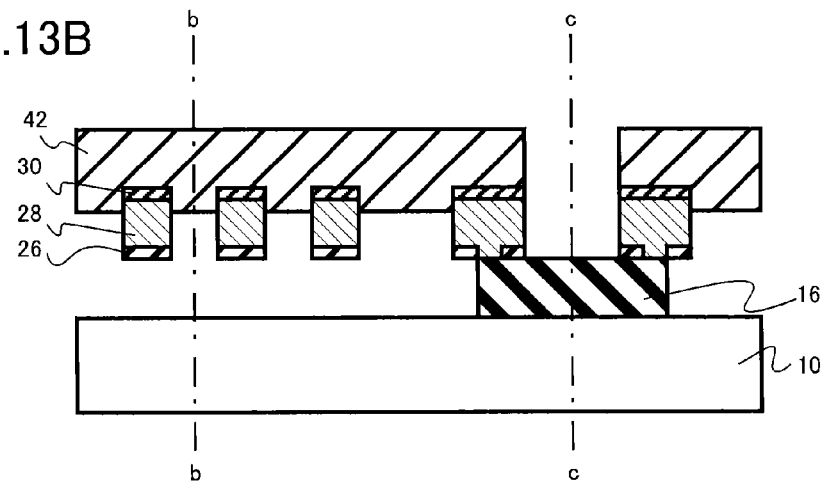
FIG.13B
FIG.13C b-b    FIG.13D c-c
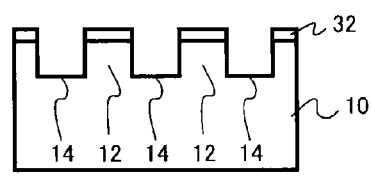
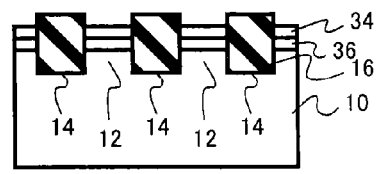

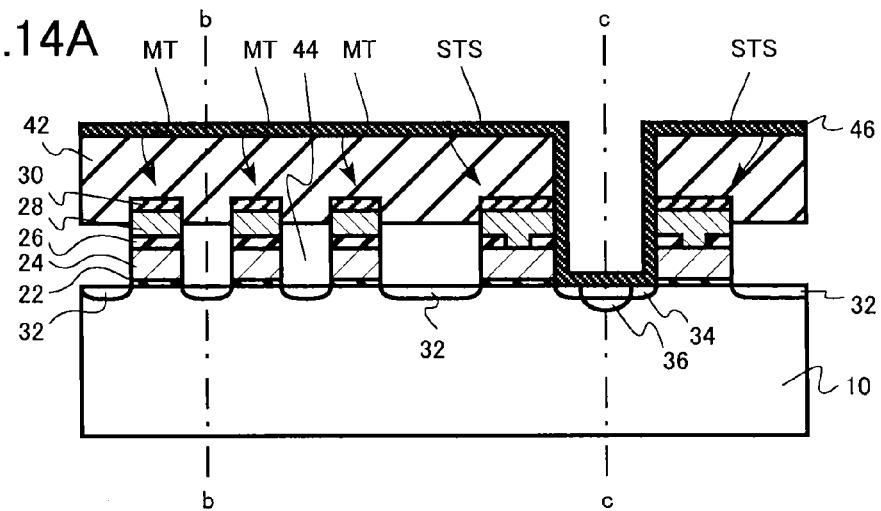
FIG.14A
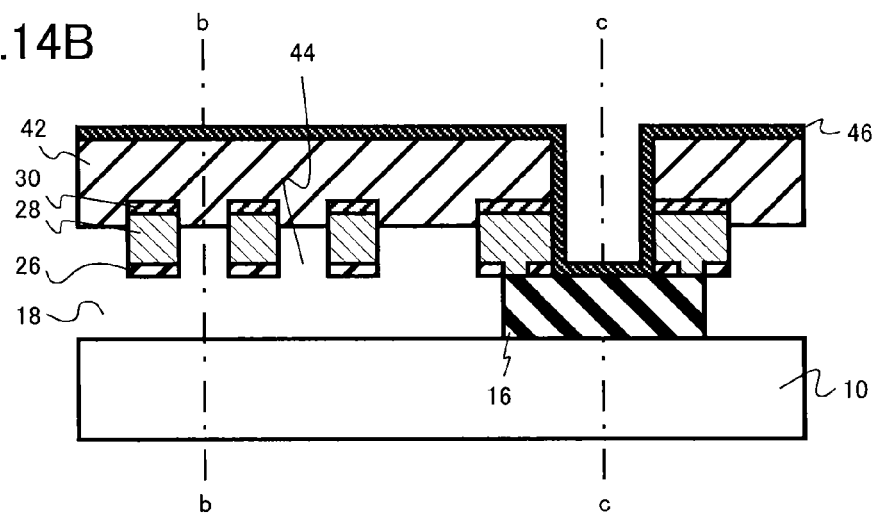
FIG.14B
FIG.14C  b-b
FIG.14D  c-c
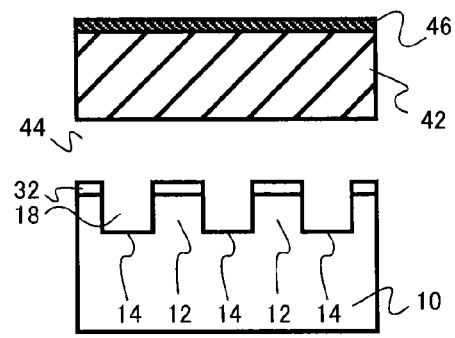
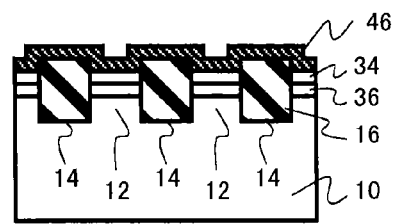

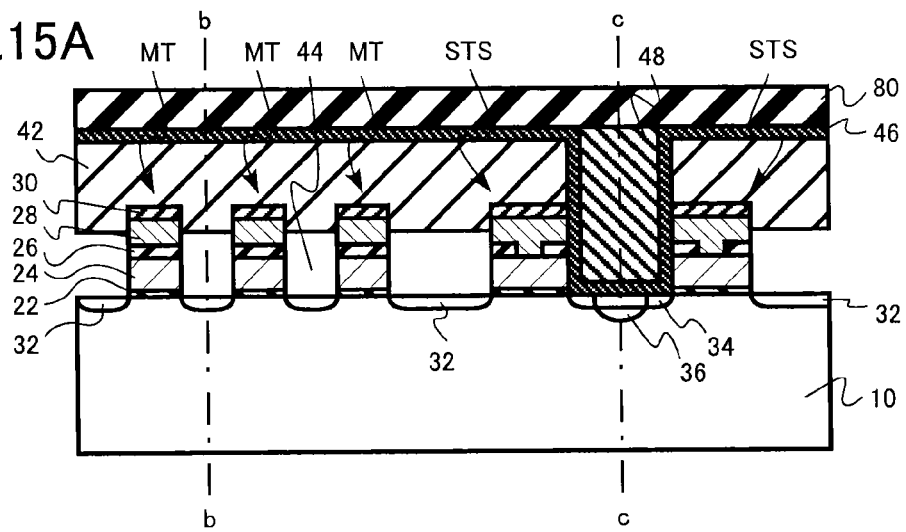
FIG.15A
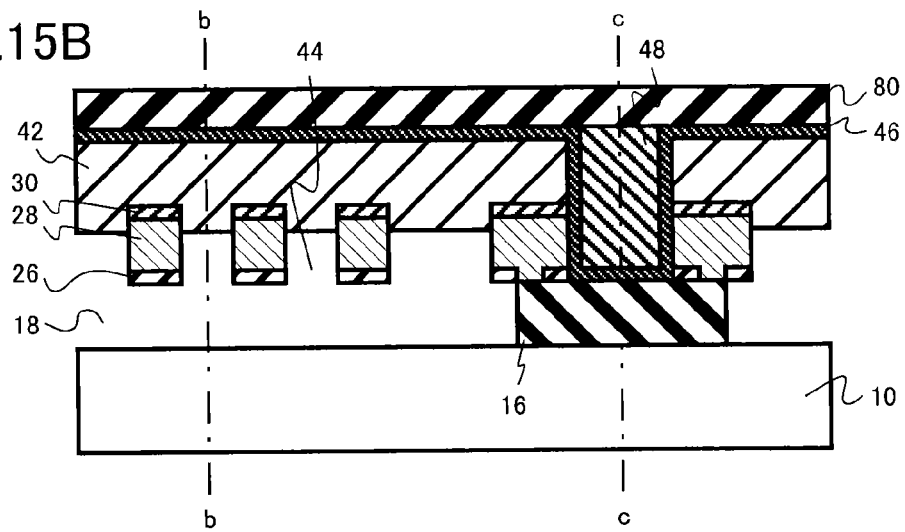
FIG.15B
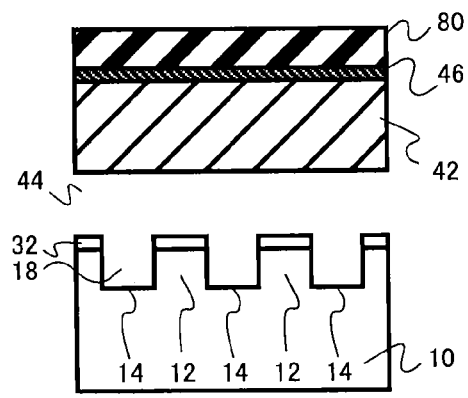
FIG.15C b-b
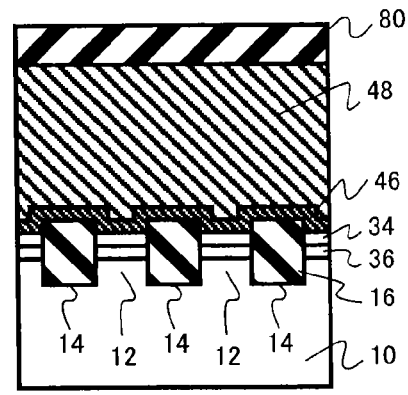
FIG.15D c-c

METHOD OF MANUFACTURING NON-VOLATILE SEMICONDUCTOR MEMORY DEVICE

CROSS-REFERENCE TO RELATED APPLICATION

This application is based upon and claims the benefit of priority from Japanese Patent Application No. 2012-064540, filed on Mar. 21, 2012, the entire contents of which are incorporated herein by reference.

FIELD

Embodiments described herein relate generally to a method of manufacturing a non-volatile semiconductor memory device.

BACKGROUND

Non-volatile semiconductor memory devices using semiconductor elements such as an EEPROM, an AND-type flash memory, a NOR-type flash memory, and a NAND-type flash memory are widely known. The NAND-type flash memory among them is advantageous in achieving high density as each memory cell shares a source/drain diffusion layer.

An end of a memory cell array of the NAND-type flash memory is provided with a select gate transistor for controlling selection and non-selection of a memory cell block. In order to achieve even higher density in the NAND-type flash memory, a space between gate electrodes of two adjacent select gate transistors may be reduced.

However, electrical contacts from upper layer electrode wiring to a substrate needs to be formed between the two adjacent select gate transistors. Thus, it is desirable to establish a manufacturing method in which a process margin in a process for forming the electrical contacts can be sufficiently secured even when the space between the gate electrodes of the select gate transistors is reduced.

As memory cells are scaled down, on the other hand, the capacitance between wirings, substrates, or between the wiring and the substrate within the memory cell array may cause a problem of degradation in device operation. In order to solve this problem, there is a method of forming air gaps in element isolation regions and between the gate electrodes.

Therefore, it is desired to establish the manufacturing method for realizing both: the formation of the air gaps in the element isolation regions and between the gate electrodes; and securing the process margin in the process for forming the electrical contacts.

BRIEF DESCRIPTION OF THE DRAWINGS

FIGS. 1A to 1D are schematic cross-sectional views of a non-volatile semiconductor memory device manufactured by a manufacturing method of an embodiment;

FIGS. 4A to 4D are schematic cross-sectional views showing the method of manufacturing a non-volatile semiconductor memory device of the embodiment;

FIGS. 5A to 5D are schematic cross-sectional views showing the method of manufacturing a non-volatile semiconductor memory device of the embodiment;

FIGS. 6A to 6D are schematic cross-sectional views showing the method of manufacturing a non-volatile semiconductor memory device of the embodiment;

FIGS. 7A to 7D are schematic cross-sectional views showing the method of manufacturing a non-volatile semiconductor memory device of the embodiment;

FIGS. 9A to 9D are schematic cross-sectional views showing the method of manufacturing a non-volatile semiconductor memory device of the embodiment;

FIGS. 10A to 10D are schematic cross-sectional views showing the method of manufacturing a non-volatile semiconductor memory device of the embodiment;

FIGS. 11A to 11D are schematic cross-sectional views showing the method of manufacturing a non-volatile semiconductor memory device of the embodiment;

FIGS. 12A to 12D are schematic cross-sectional views showing the method of manufacturing a non-volatile semiconductor memory device of the embodiment;

FIGS. 13A to 13D are schematic cross-sectional views showing the method of manufacturing a non-volatile semiconductor memory device of the embodiment;

FIGS. 14A to 14D are schematic cross-sectional views showing the method of manufacturing a non-volatile semiconductor memory device of the embodiment;

FIGS. 15A to 15D are schematic cross-sectional views showing the method of manufacturing a non-volatile semiconductor memory device of the embodiment;

FIGS. 16A to 16D are schematic cross-sectional views showing the method of manufacturing a non-volatile semiconductor memory device of the embodiment; and FIGS. 17A to 17D are schematic cross-sectional views showing the method of manufacturing a non-volatile semiconductor memory device of the embodiment.

DETAILED DESCRIPTION

Figure 1A:
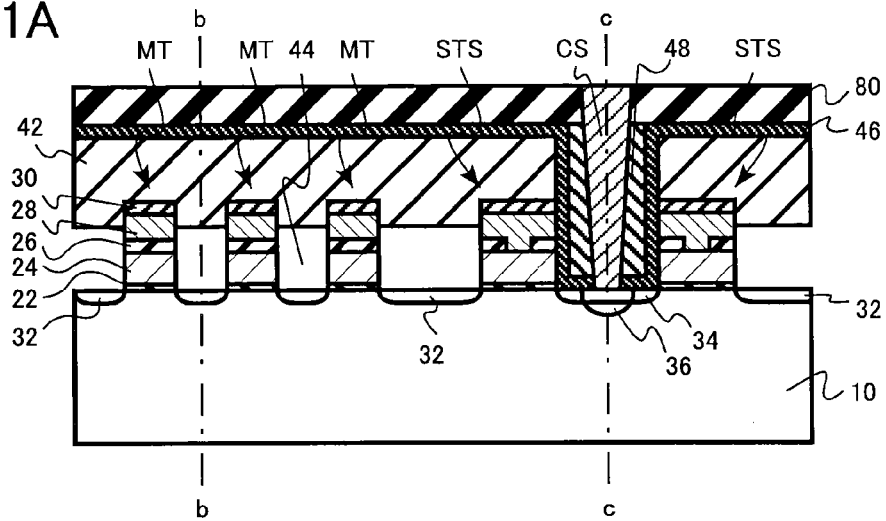

A method of manufacturing a non-volatile semiconductor memory device of an embodiment includes: forming, on a semiconductor substrate, a plurality of element regions extended in a first direction and arranged in parallel with each other, and an element isolation region for mutually isolating the element regions and filled with a first insulating film; forming, on the element regions, a plurality of memory cell gate electrodes extended in a second direction orthogonal to the first direction and arranged in parallel with each other; etching the first insulating film, after forming the memory cell gate electrodes, so that the first insulating film remains in at least the element isolation region of a region in which a select gate electrode is to be formed; forming a second insulating film on the memory cell gate electrodes to create a gap between the memory cell gate electrodes; forming two select gate electrodes extended in the second direction and arranged side by side in parallel with each other, on the element regions of the region in which the select gate electrodes are to be formed; forming carbon side walls on the select gate electrodes; implanting ions of an impurity into the element regions between the two select gate electrodes with the carbon side walls as a mask; and removing the carbon side walls.

The method of manufacturing a non-volatile semiconductor memory device of the embodiment includes forming, on the semiconductor substrate: the plurality of element regions extended in the first direction (a bit line direction or a column direction) and arranged in parallel with each other; and the element isolation regions for mutually isolating the element regions and filled with the first insulating film. The plurality of memory cell gate electrodes, extended in the second direction (a word line direction or a row direction) orthogonal to the first direction and arranged in parallel with each other, is then formed on the element regions. The first insulating film is etched after forming the memory cell gate electrodes so that the first insulating film remains in at least the element isolation regions of the region in which the select gate electrodes are to be formed. The second insulating film is then formed on the memory cell gate electrodes to create the gaps between the memory cell gate electrodes. The two select gate electrodes, extended in the second direction and arranged adjacently in parallel with each other, are formed on the element regions of the region in which the select gate electrodes are to be formed, and the carbon side walls are formed on the select gate electrodes. Then, the ions of the impurity are implanted into the element regions between the two select gate electrodes with the carbon side walls as the mask, after which the carbon side walls are removed. The non-volatile semiconductor memory device of the present embodiment is a NAND-type flash memory.

The method of manufacturing a non-volatile semiconductor memory device of the embodiment includes forming the gaps for reducing the capacitance in the element isolation regions and between the gate electrodes of a memory cell part, after forming the memory cell gate electrodes. Then, the select gate electrodes are formed. The carbon side walls are formed thereafter on the select gate electrodes, and the impurity ions are implanted for forming a source/drain.

When removing the carbon side walls, it becomes easier to have a high selectivity ratio to an element isolation insulating film that fills the element isolation regions. Consequently, excessive etching of the element isolation insulating film under the select gate electrodes can be suppressed when removing the carbon side walls.

This can therefore inhibit the air gaps formed in the element isolation regions and between the memory cell gate electrodes from being filled with an etching stopper film to be deposited at a later stage, resulting from the element isolation insulating film under the select gate electrodes being removed.

Thus, according to the present embodiment, the gaps can be formed in the element isolation regions and between the memory cell gate electrodes while, at the same time, a process margin in a process for forming electrical contacts can be secured.

Figure 2:
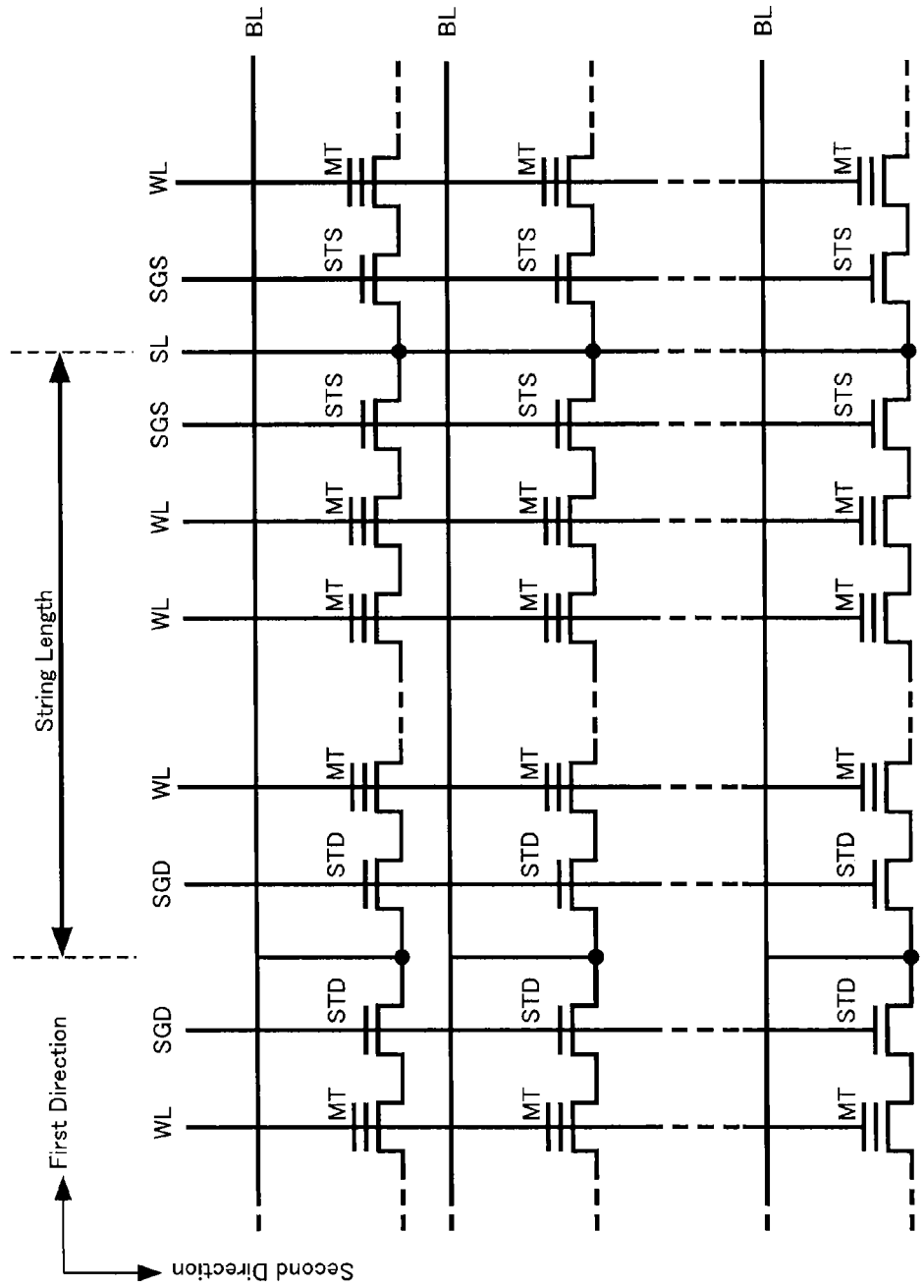
FIG. 2 is an equivalent circuit diagram of the non-volatile semiconductor memory device manufactured by the manufacturing method of the embodiment.

FIG. 2 is an equivalent circuit diagram of the memory cell part of the non-volatile semiconductor memory device manufactured by the manufacturing method of the embodiment.

As shown in FIG. 2, a memory cell array includes a plurality of memory cell transistors MT. In the memory cell array, the memory cell transistors are disposed in a matrix in the column direction (hereinafter also referred to as the first direction or the bit line direction) and in the row direction (hereinafter also referred to as the second direction or the word line direction).

In the memory cell part, the plurality of memory cell transistors MT and select gate transistors STS and STD are connected in series to form NAND strings. The length of a repeating unit of the NAND strings is referred to as a string length.

A drain region of the select gate transistor STS for selecting a group of memory cell transistors MT is connected to a source region of the memory cell transistor MT arranged at one end of an array of the group of memory cell transistors MT connected in series to form one NAND string. Also, a source region of the select gate transistor STD for selecting the group of memory cell transistors MT is connected to a drain region of the memory cell transistor MT arranged at the other end of the array of the group of memory cell transistors MT connected in series to form one NAND string.

A common source line SL is connected to a source region of the select gate transistor STS.

Each gate electrode (memory cell gate electrode) of the memory cell transistors MT forms a word line WL. The word line WL is connected to a word line switch transistor (not shown). Each word line WL is connected to a booster circuit or the like through the word line switch transistor. Then, an operating voltage applied to the gate electrodes of the word line WL is controlled by the word line switch transistor.

A common select gate line SGS of the select gate transistors STS and a common select gate line SGD of the select gate transistors STD are each connected to a select gate switch transistor (not shown). Operating voltages applied to the gate electrodes (select gate electrodes) of the select gate transistors STS and STD are controlled by the select gate switch transistor.

A bit line BL is connected to each drain of the select gate transistors STD by a bit line contact. The bit line BL is connected to a sense amplifier (not shown) for amplifying data read from the selected memory cell transistor via the bit line BL.

In the NAND-type flash memory, a chip area can be reduced by shortening the string length of the NAND string that is a basic repeating unit in the memory cell part.

Figure 3:
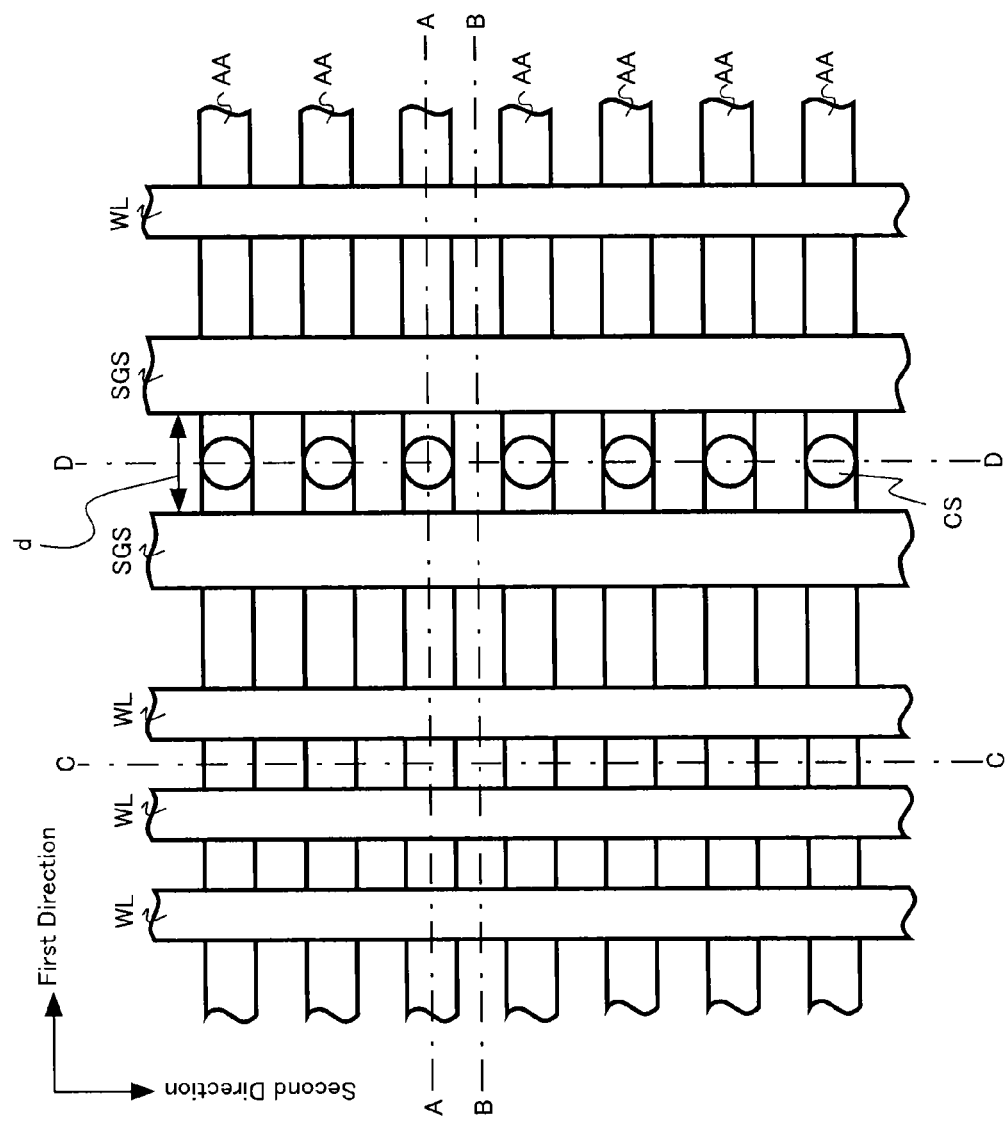
FIG. 3 is a view showing one example of a layout of the non-volatile semiconductor memory device manufactured by the manufacturing method of the embodiment.
Figure 4A:
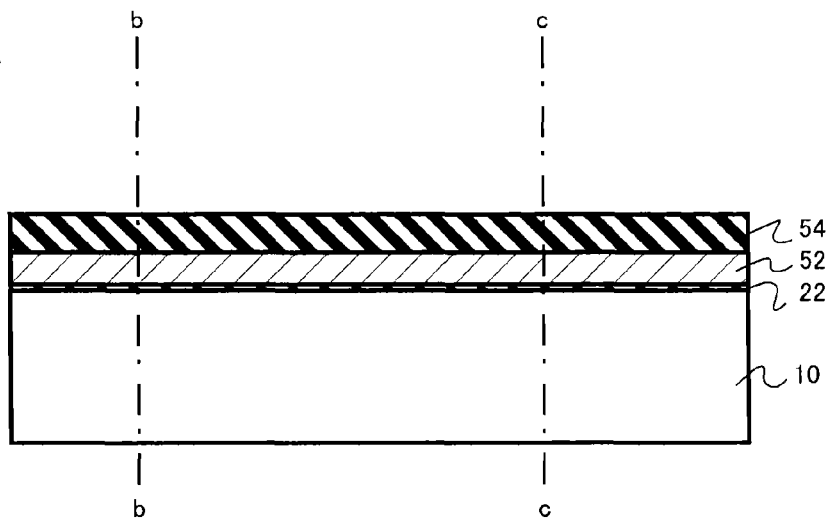
Figure 4B:
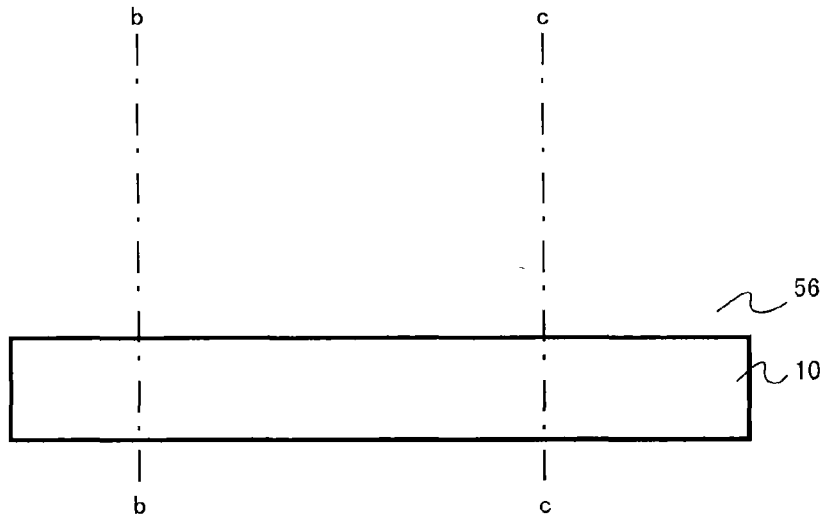
Figure 4B:
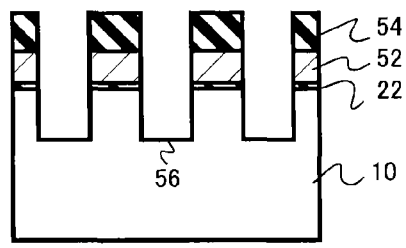
Figure 4B:
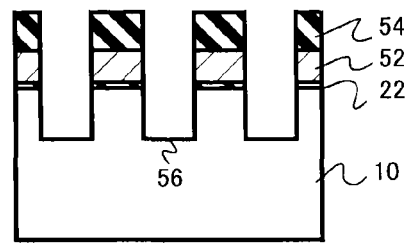
Figure 5A:
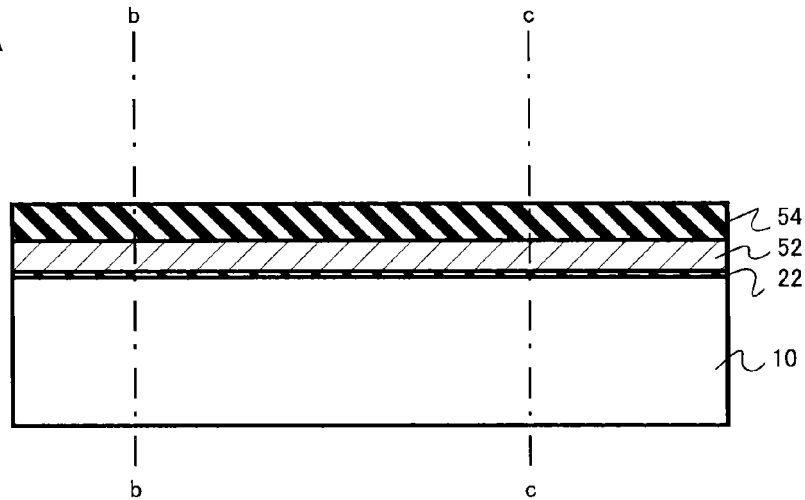
Figure 5B:
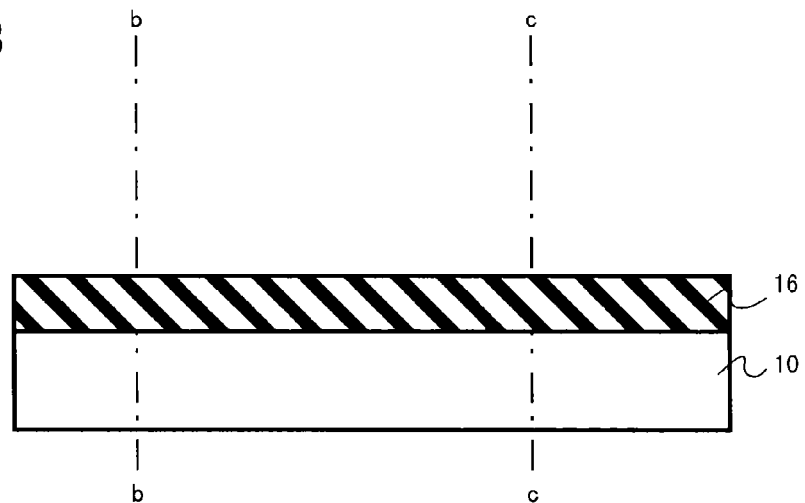
Figure 5B:
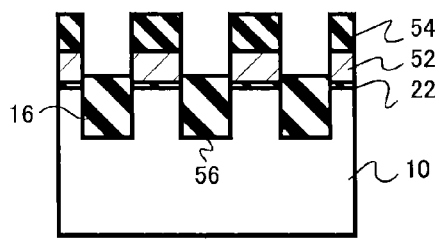
Figure 5B:
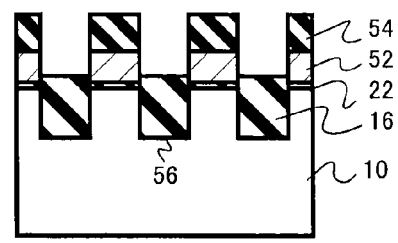
Figure 6A:
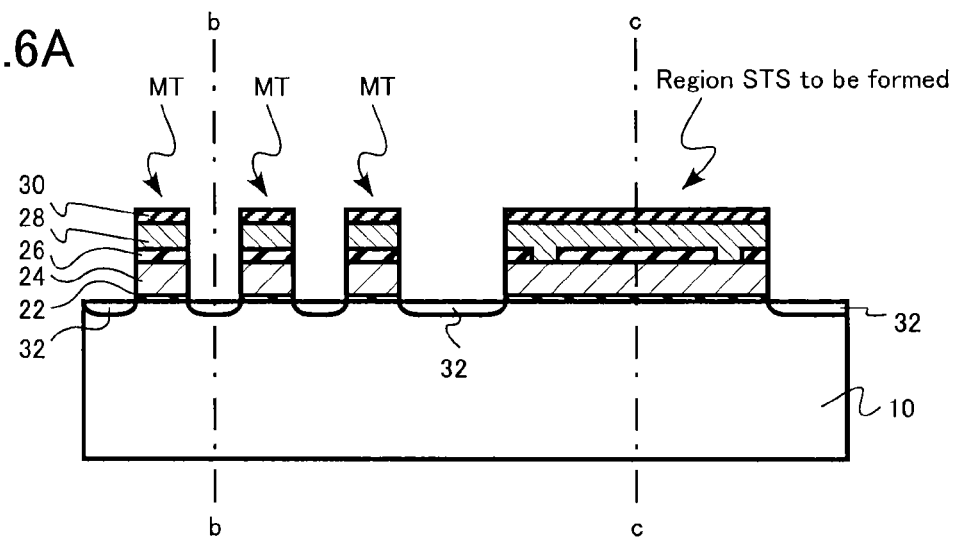
Figure 6B:
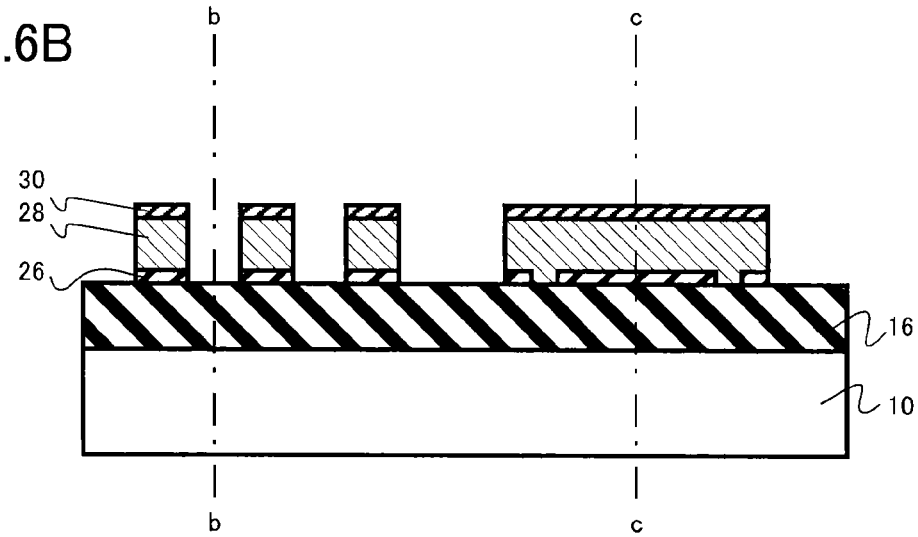
Figure 6B:
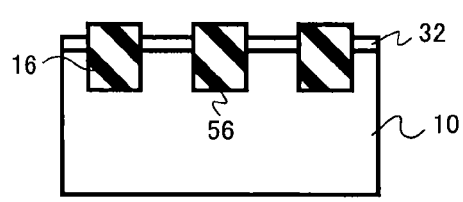
Figure 6B:
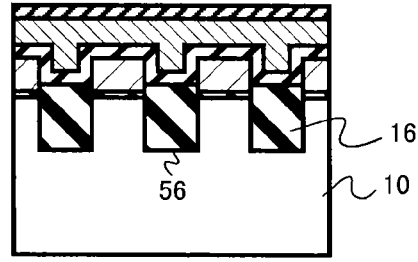

FIG. 3 is a view showing one example of a layout of the memory cell part of the non-volatile semiconductor memory device manufactured by the manufacturing method of the present embodiment. A plurality of cell element regions AA extended in the first direction (the bit line direction) and arranged in parallel with each other, and the element isolation regions for mutually isolating the cell element regions AA are formed in the memory cell part. On these cell element regions AA, the plurality of word lines WL (memory cell gate electrodes) is formed extending in the second direction (the word line direction) orthogonal to the first direction and arranged in parallel with each other.

Furthermore, two select gate lines SGS (select gate electrodes) extended in the second direction and arranged adjacently in parallel with each other are formed on the cell element regions AA. Source line contacts CS are provided between the two select gate lines SGS and connected to the common source line SL. Here, an interval between the two select gate lines SGS is referred to as a select gate electrode interval d. The string length can be shortened by narrowing the select gate electrode interval d.

Although not shown in FIG. 3, a peripheral element region is formed outside the memory cell part for forming a peripheral transistor.

Figure 1B:
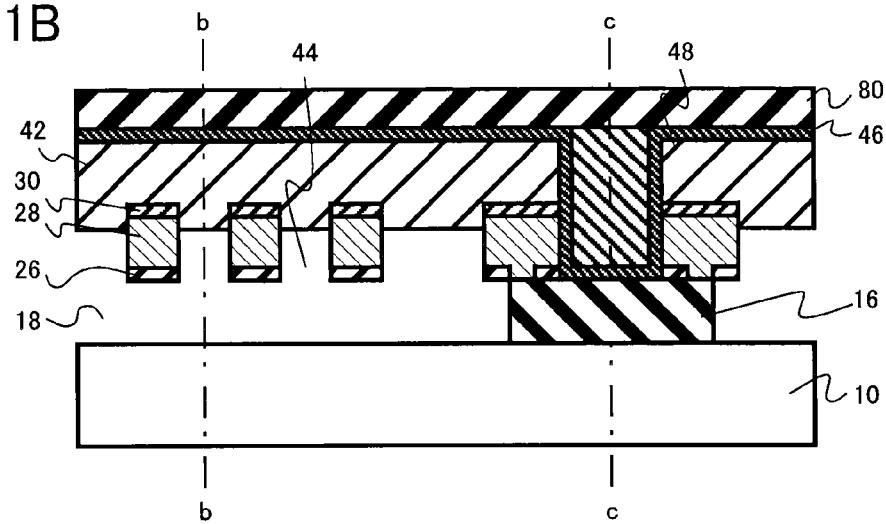
Figure 1B:
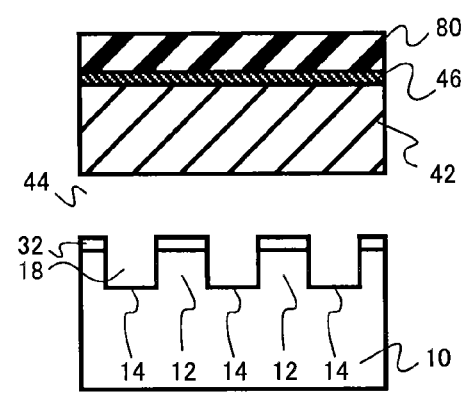
Figure 1B:
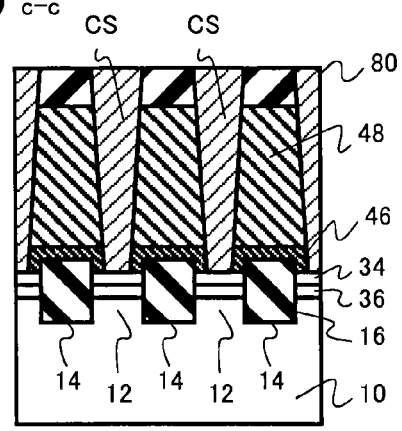

FIGS. 1A to 1D are schematic cross-sectional views of the non-volatile semiconductor memory device manufactured by the manufacturing method of the embodiment. FIG. 1A is a cross-sectional view taken along line A-A of FIG. 3. FIG. 1B is a cross-sectional view taken along line B-B of FIG. 3. FIG. 1C is a cross-sectional view taken along line C-C of FIG. 3. FIG. 1C is also a cross-sectional view taken along line b-b of FIG. 1A. FIG. 1D is a cross-sectional view taken along line D-D of FIG. 3. FIG. 1D is also a cross-sectional view taken along line c-c of FIG. 1A.

As shown in FIGS. 1A to 1D, the non-volatile semiconductor memory device is formed by using a p-type silicon semiconductor substrate 10, for example. The impurity of the semiconductor substrate 10 is boron (B), for example.

Cell element regions 12 and element isolation regions 14 for mutually isolating the cell element regions are formed on the semiconductor substrate 10. The memory cell transistors MT and the select gate transistors STS are formed on the cell element regions 12.

Air gaps 18 are formed in the element isolation regions 14. By these air gaps 18, the interference (or proximity effect) between the adjacent memory transistors MT with the element isolation region 14 therebetween can be suppressed.

An element isolation insulating film 16 is formed in the element isolation regions 14 under the select gate electrodes STS. The element isolation insulating film 16 is, for example, a silicon oxide film. The element isolation insulating film 16 may be present in a part of the element isolation regions 14 of the memory cell part.

Each memory cell transistor MT includes: a gate insulating film 22 formed on the silicon semiconductor substrate 10; and the gate electrode (the memory cell gate electrode) formed on the gate insulating film 22. The gate electrode includes, on top of the gate insulating film 22, a floating gate electrode 24, an inter-gate insulating film 26, and a control gate electrode 28. In addition, a hard mask layer 30 used for processing the gate electrode is formed on the control gate electrode 28, for example.

The gate insulating film 22 is, for example, a thermal silicon oxide film. The floating gate electrode 24 is, for example, a polycrystalline silicon film. The inter-gate insulating film 26 is, for example, an ONO (Oxide-Nitride-Oxide) film. Also, the control gate electrode 28 is, for example, a laminated film of a polysilicon film and a tungsten (W) film. Materials for the control gate electrode 28 are not particularly limited and may be a silicide film such as a cobalt silicide (CoSi) film and a nickel silicide (NiSi) film, another metal film, or the laminated film of the polysilicon film and the silicide film or the metal film. The hard mask layer 30 is, for example, a silicon nitride film.

In addition, an $n^-$-type diffusion layer 32 as a source/drain region is provided in the semiconductor substrate 10 of the memory cell part. The $n^-$-type diffusion layer 32 is provided in a manner to interpose each memory cell gate electrode therebetween. The $n^-$-type diffusion layer 32 includes arsenic (As) as an impurity, for example.

The select gate transistors STS are provided with an $n^-$-type diffusion layer 34 as the source/drain region. In addition to the $n^-$-type diffusion layer 34, an $n^+$-type diffusion layer 36 is formed in the semiconductor substrate 10 between the select gate electrodes, the $n^+$-type diffusion layer 36 having a deeper junction depth and a higher impurity concentration than the $n^-$-type diffusion layer 34. The n"-type diffusion layer 34 and the $n^+$-type diffusion layer 36 include arsenic (As) as the impurity, for example.

An inter-layer insulating film (a second insulating film) 42 is formed on the memory cell gate electrodes, and air gaps 44 are formed between the memory cell gate electrodes. By these air gaps 44, the inter-wiring capacitance between the memory cell gate electrodes and the capacitance between the memory cell gate electrodes and the semiconductor substrate 10 are reduced. The inter-layer insulating film 42 is, for example, a plasma TEOS (Tetraethyl orthosilicate) film or a plasma $SiH_4$ film formed by a plasma CVD (Chemical Vapor Deposition) method.

An etching stopper film 46 serving as an etching stopper when forming the source line contacts CS is formed on the inter-layer insulating film 42. The etching stopper film 46 is, for example, a silicon nitride film.

The space between the select gate electrodes is filled with an inter-layer insulating film 48 on top of the etching stopper film 46. The inter-layer insulating film 48 is, for example, a BPSG (Boron Phosphorous doped Silicate Glass) film. Furthermore, the source line contacts CS for connecting the source line (not shown) and the source/drain regions of the select gate transistors STS are formed.

In addition, for example, a silicon oxide film (not shown) may be formed between the etching stopper film 46 and the semiconductor substrate of the element regions 12 at the bottom of the space between the select gate electrodes.

As described above, the element isolation insulating film 16 remains partly under the select gate electrodes.

Now, the method of manufacturing a non-volatile semiconductor memory device of the present embodiment will be described with reference to FIGS. 4A to 17D. FIGS. 4A to 17D are schematic cross-sectional views showing the method of manufacturing a semiconductor memory device of the present embodiment. Also, for example, FIGS. 4A, 4B, 4C and 4D are the cross-sectional views of positions corresponding to FIGS. 1A, 1B, 1C and 1D, respectively. The same can be applied to FIGS. 5A to 17D.

First, as shown in FIGS. 4A to 4D, the gate insulating film 22 is formed on the p-type silicon semiconductor substrate 10 by thermal oxidation. Then, a polycrystalline silicon film 52 containing phosphorus (P) or boron (B) as the impurity is deposited on the gate insulating film 22 by an LPCVD method in order to form the floating gate electrode. A silicon nitride film 54 is thereafter formed by the LPCVD method.

Then, the silicon nitride film 54 is patterned by lithography technique and an RIE (Reactive Ion Etching) method that is dry etching. The polycrystalline silicon film 52, the gate insulating film 22, and the semiconductor substrate 10 are sequentially etched by the RIE method, with the patterned silicon nitride film 54 as a mask, in order to form trenches 56 for forming the element isolation regions.

Next, as shown in FIGS. 5A to 5D, the element isolation insulating film (the first insulating film) 16 is embedded into the trenches 56. It is desirable that the element isolation insulating film 16 be, for example, a silicon oxide film, an etching rate of which with a hydrofluoric acid is greater than that of a thermal silicon oxide film, from a perspective that the air gaps would be formed in the element isolation regions 14 at a later stage. The element isolation insulating film 16 is, for example, the silicon oxide film formed by using a polysilazane film that is an SOG (Spin on Glass). The etching rate of the silicon oxide film with a hydrofluoric acid is approximately one hundred times that of the thermal silicon oxide film, the silicon oxide film being formed by using the polysilazane film. The element isolation insulating film 16 after being embedded into the trenches 56 is flattened out by a CMP (Chemical Mechanical Polishing) method, for example, and is further etched back by the RIE method, for example.

In this manner, the plurality of cell element regions 12 extended in the first direction and arranged in parallel with each other and the element isolation regions 14 for mutually isolating the cell element regions 12 are formed on the semiconductor substrate 10, in order to form the memory cell transistors MT and the select gate transistors STS.

Next, as shown in FIGS. 6A to 6D, the silicon nitride film 54 is exfoliated with thermal phosphoric acid, for example. The ONO film is formed as the inter-gate insulating film 26, for example, and a laminated film of the polycrystalline silicon film containing phosphorus (P) or boron (B) as the impurity, a tungsten nitride (WN) film, and the tungsten (W) film is formed for the control gate electrode 28, for example. Openings are provided in the ONO film in the select gate electrode part and the peripheral gate electrode part.

Furthermore, the hard mask layer 30 of the silicon nitride film used for processing the gate electrodes is formed on the polycrystalline silicon film. The hard mask layer 30 is then patterned by the lithography technique and the RIE method.

At this time, the hard mask layer 30 is patterned such that the gate electrode wiring is not formed in the regions where the select gate transistors STS and the peripheral transistor are to be formed. That is, the hard mask layer 30 is patterned such that only the gate electrodes of the memory cell transistors MT are patterned. Here, an electrode pattern with a width equivalent to the sum of the two select gate electrodes formed later and a space therebetween is formed in the region in which the select gate electrodes (the select gate transistors STS) are to be formed.

The memory cell gate electrodes are formed, with the patterned hard mask layer 30 as the mask, by sequentially etching with the RIE method: the laminated film of the polycrystalline silicon film, the tungsten nitride (WN) film, and the tungsten (W) film; the ONO film; and the polycrystalline silicon film 52.

In this way, the plurality of memory cell gate electrodes extended in the second direction orthogonal to the first direction and arranged in parallel with each other is formed on the cell element regions (first element regions) 14.

After that, the $n^-$-type diffusion layer 32 is formed by implanting ions of arsenic (As), for example, and the ions are heated for activation thereafter.

Now, as shown in FIGS. 7A to 7D, the element isolation insulating film (the first insulating film) 16 is etched after forming the memory cell gate electrodes, such that the element isolation insulating film (the first insulating film) 16 remains at least under the select gate electrodes. This etching is performed with a dilute hydrofluoric acid, for example, as the after-treatment of processing the gate electrodes by the RIE method.

An insulating film having a high etching rate with respect to the hydrofluoric acid is used for the element isolation insulating film (the first insulating film) 16, such as the silicon oxide film formed by using the polysilazane film. Therefore, the element isolation insulating film (the first insulating film) 16 is etched to a greater degree than the gate insulating film 22 that is the thermal silicon oxide film by, for example, the dilute hydrofluoric acid treatment performed as the after-treatment of processing the gate electrodes.

The element isolation insulating film (the first insulating film) 16 is etched by properly controlling an etching time, for example, so that the film remains in the region in which the select gate transistors (STS) are to be formed. This is to prevent the air gaps in the element isolation regions 14 and the air gaps between the memory cell gate electrodes from being filled with the insulating film when the film is later deposited between the select gate electrodes.

Figure 7A:
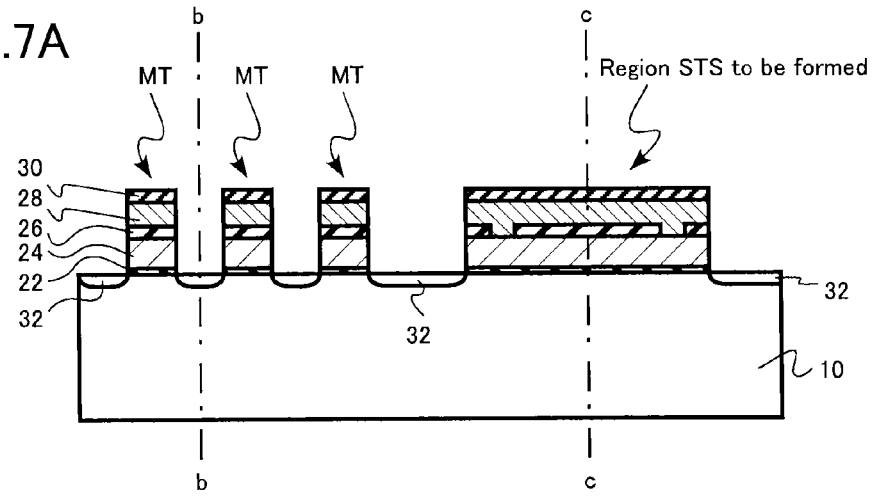
Figure 7B:
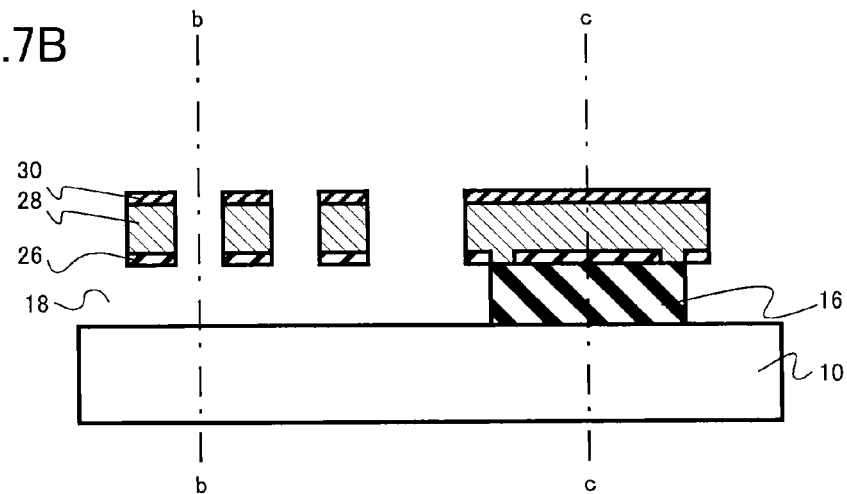
Figure 7B:
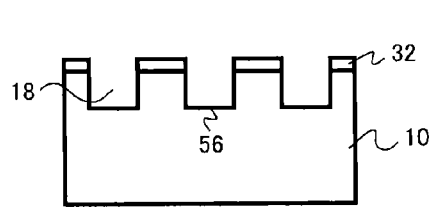
Figure 7B:
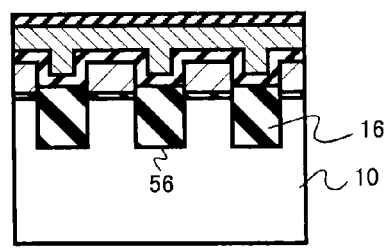
Figure 8A:
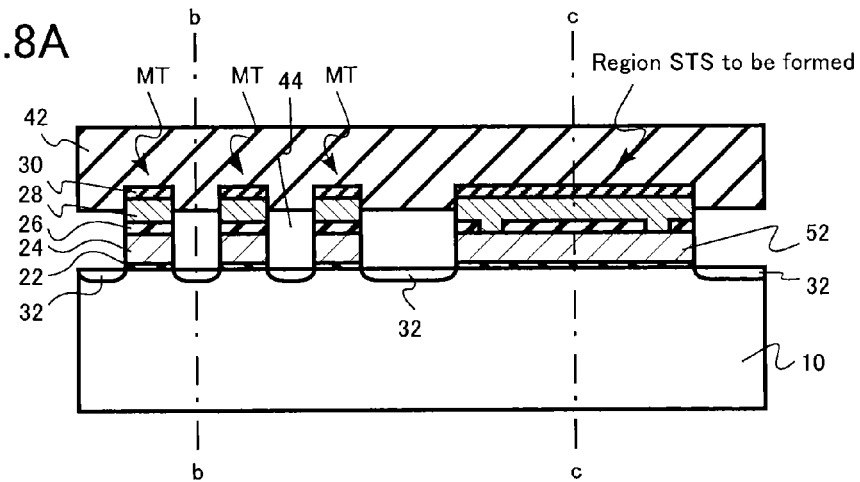
FIGS. 8A to 8D are schematic cross-sectional views showing the method of manufacturing a non-volatile semiconductor memory device of the embodiment.
Figure 8B:
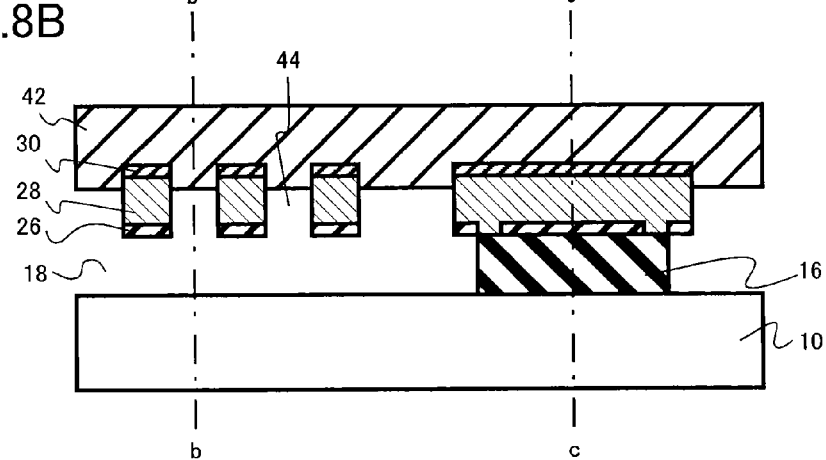
Figure 8C:
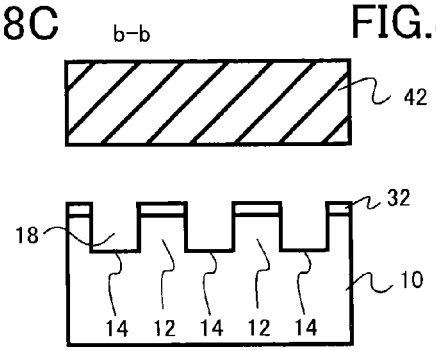
Figure 8D:
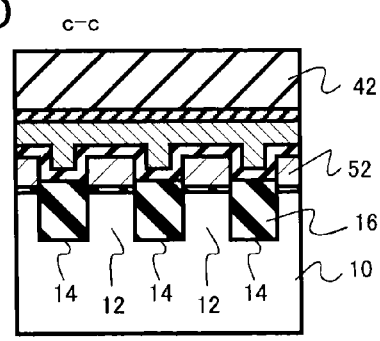
Figure 9A:
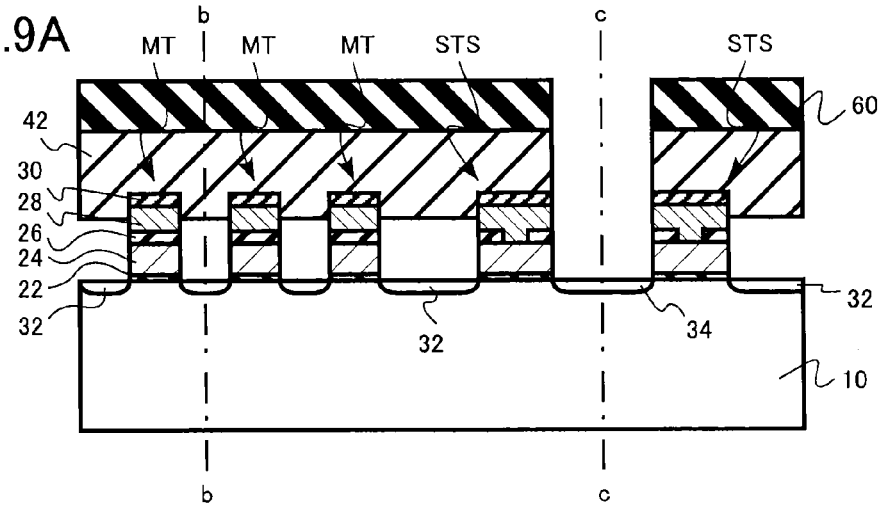
Figure 9B:
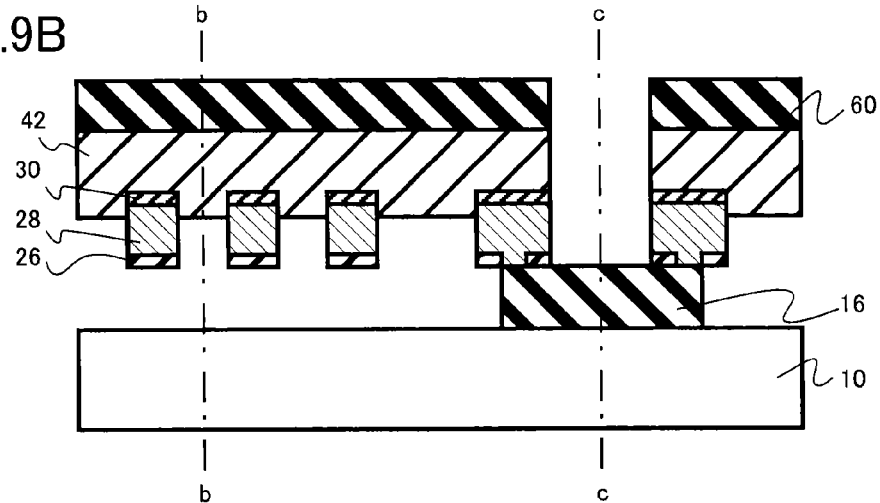
Figure 9B:
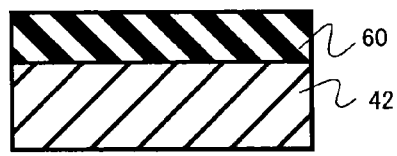
Figure 9B:
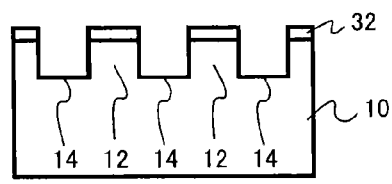
Figure 9B:
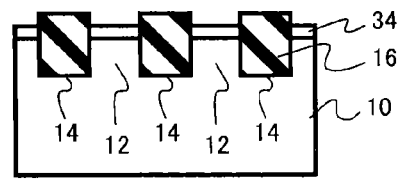
Figure 16A:
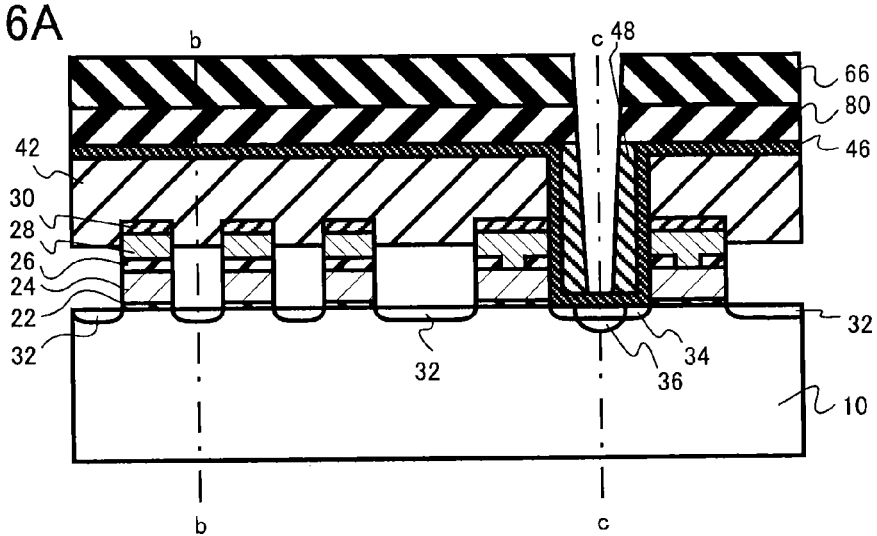
Figure 16B:
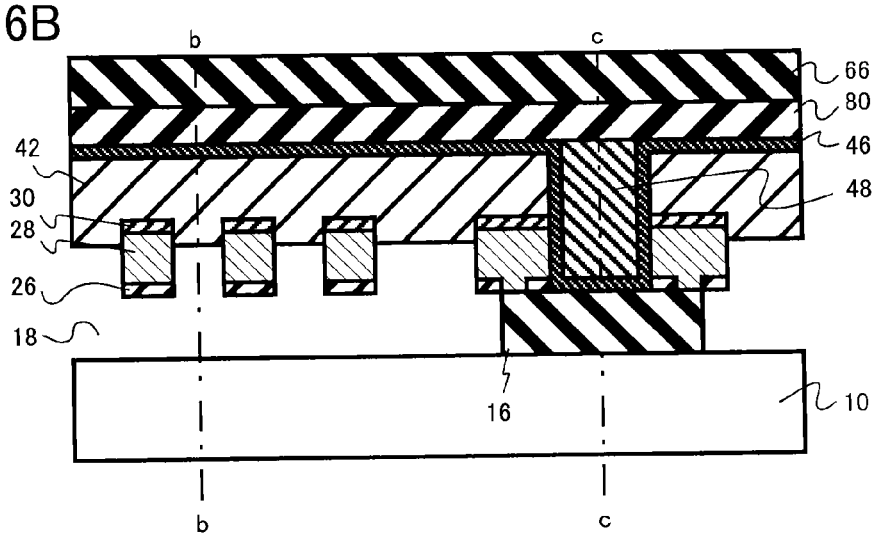
Figure 16B:
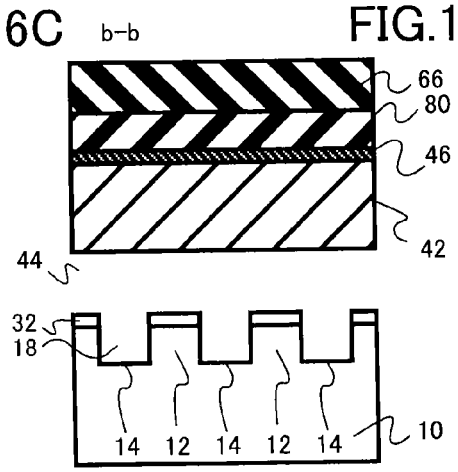
Figure 16B:
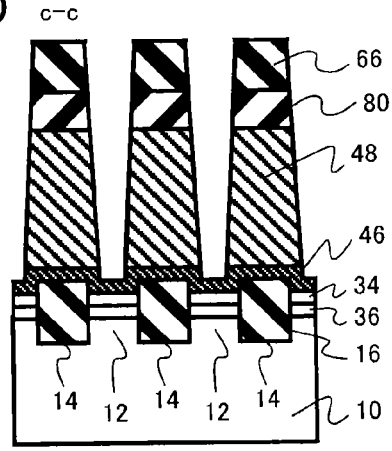
Figure 17A:
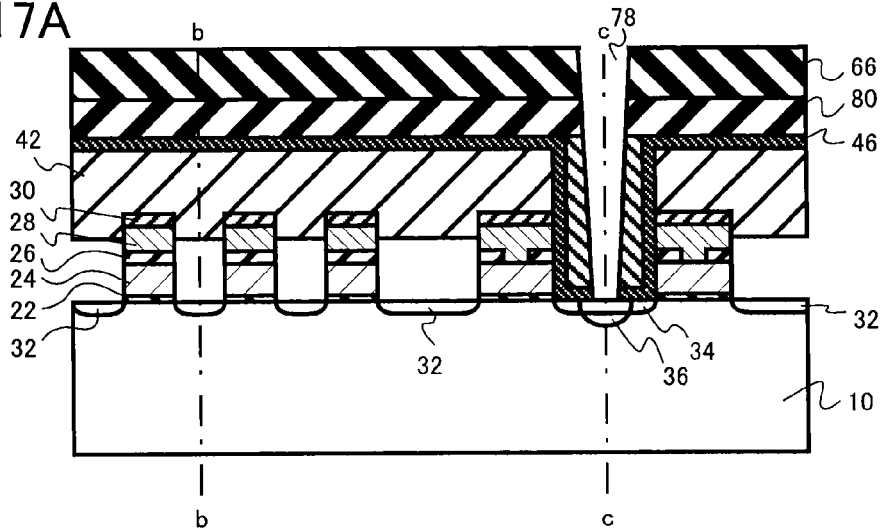
Figure 17B:
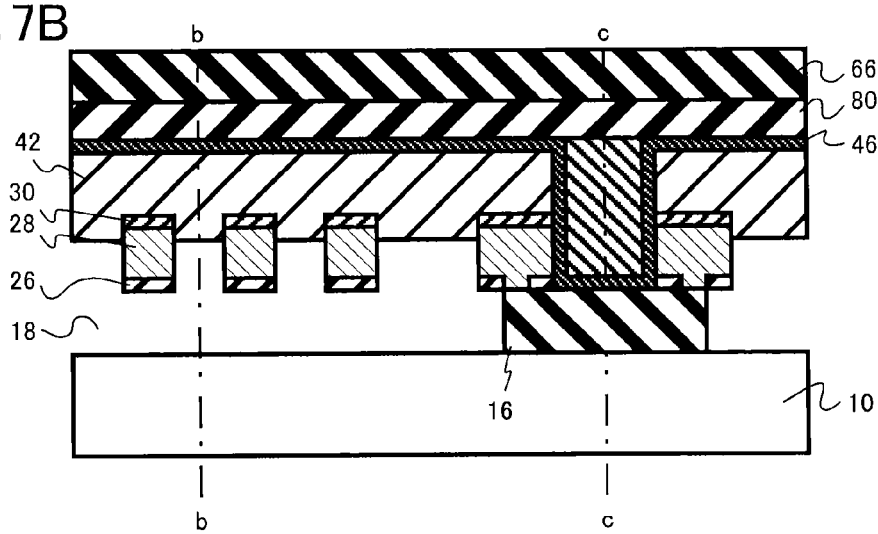
Figure 17B:
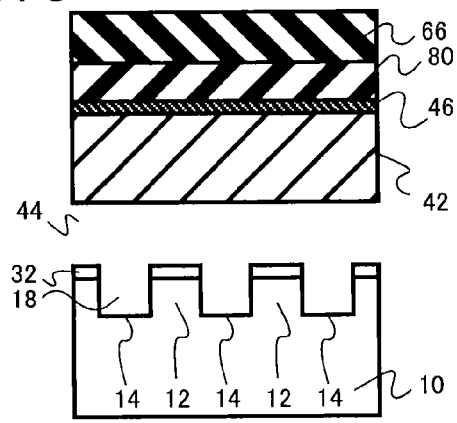
Figure 17B:
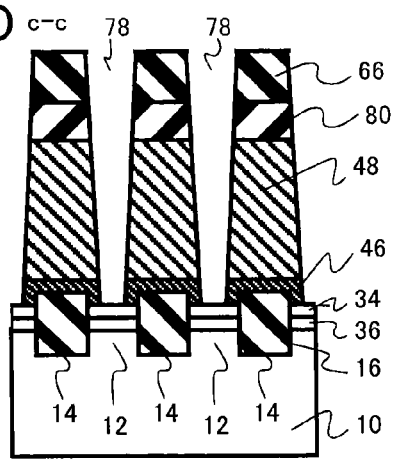

Moreover, when etching the element isolation insulating film (the first insulating film) 16, it is desirable that the air gaps be formed to pass through the first insulating film under the memory cell gate electrodes, as shown in FIG. 7B. This is because the capacitance between the element regions and between the wiring and the substrate can be greatly reduced.

Next, as shown in FIGS. 8A to 8D, the inter-layer insulating film (the second insulating film) 42 is formed on the memory cell gate electrodes to create the air gaps 18 and air gaps 44 between the cell element regions 12 and between the memory cell gate electrodes, respectively. The capacitance between the wirings of the memory cell gate electrodes and between the memory cell gate electrodes and the substrate can be reduced by the formation of the air gaps 18 and the air gaps 44, whereby erroneous operation due to interference between the memory cells as well as wiring delay can be suppressed.

In order to form the air gaps 18 and the air gaps 44, a film with inferior step coverage such as the plasma TEOS film or the plasma $SiH_4$ film formed by the plasma CVD method may be used as the inter-layer insulating film 42. The hard mask layer 30 is then patterned by means of the lithography technique and the RIE method.

Now, as shown in FIGS. 9A to 9D, the two select gate electrodes extended in the second direction and arranged side by side in parallel with each other are formed on the cell element regions 12. The two select gate electrodes are formed by patterning to divide the electrode pattern formed in the select gate-forming region, when forming the memory cell gate electrodes. Specifically, the two select gate electrodes are formed, with the resist pattern 60 as the mask, by sequentially etching with the RIE method: the inter-layer insulating film 42; the hard mask layer; the laminated film of the polycrystalline silicon film, the tungsten nitride (WN) film, and the tungsten (W) film; the ONO film; and the polycrystalline silicon film 52. In this case, peripheral gate electrodes of the peripheral gate transistor may be formed at the same time on the peripheral element region.

After removing the resist pattern 60, the $n^-$-type diffusion layer 34 is formed by implanting ions of arsenic (As), for example, and the ions are heated for activation thereafter.

After implanting the ions, for example, the dilute hydrofluoric acid treatment is performed as the after-treatment of processing the gate electrodes. In this after-treatment, the etching amount is properly controlled so that the element isolation insulating film 16 is etched as little as possible.

Next, as shown in FIGS. 10A to 10D, a carbon film 70 with a thickness of approximately 40 nm, for example, is formed on the inter-layer insulating film (the second insulating film) 42 by the CVD method, for example.

Then, as shown in FIGS. 11A to 11D, the carbon film 70 is etched by the RIE method, for example, in order to form carbon side walls 72 on the opposing side surfaces (side walls) of the select gate electrodes. In this case, the etching selectivity ratio of the element regions 12 with respect to silicon can be extremely high; as a result, the amount of the substrate dug in the element regions 12 accompanying the formation of the carbon side walls 72 is reduced, thereby suppressing the degradation in characteristics of the select gate transistors.

Now, as shown in FIGS. 12A to 12D, ions of an impurity are implanted in the element regions 12 between the two select gate electrodes by using the carbon side walls 72 as the mask. For example, the ions of arsenic (As) are implanted to form the $n^+$-type diffusion layer 36. At this time, the carbon side walls 72 and the $n^+$-type diffusion layer may be formed for the transistor of a peripheral circuit part that is not shown. When forming the side walls for the transistor of the peripheral circuit part, the side walls may have the pattern such that the resist pattern 60 opens the ends of gate electrodes of the peripheral circuit part.

Next, as shown in FIGS. 13A to 13D, the carbon side walls 72 used as the mask for implanting the ions are removed. By removing the side walls of the select gate electrodes, a margin for a contact opening when forming a contact hole later will be enlarged. Thus, the formation of a contact pattern on the side walls can avoid a problem that a contact opening area is reduced or that the contact is left unopened.

It is desirable that the carbon side walls 72 be etched and removed by ashing, that is, plasma containing oxygen. It is because, by ashing, the etching selectivity ratio of carbon to the element isolation insulating film 16 can be set large when the element isolation insulating film 16 is formed of a silicon oxide film or another insulating film, for example, and the element isolation insulating film 16 is etched less when removing the carbon side walls 72. Moreover, ashing is desired in that the etching selectivity ratio with respect to an electrode material of the select gate electrodes or the inter-layer insulating film 42 can be set large.

For example, if the side walls of the select gate electrodes and the element isolation insulating film 16 are both formed of the silicon oxide films, the element isolation insulating film 16 under the select gate electrodes would be etched greatly by the etching performed for removing the side walls. Therefore, there is a possibility that the element isolation insulating film 16 under the select gate electrodes would be penetrated.

Next, as shown in FIGS. 14A to 14D, the etching stopper film 46 is formed on the inter-layer insulating film 42 in the element regions between the two select gate electrodes. The etching stopper film 46 is, for example, a silicon nitride film with a thickness of approximately 20 nm formed by the LPCVD method.

Here, the air gaps 18 and the air gaps 44 of the memory cell array part would not be filled with the etching stopper film 46 even if the film is an LPCVD film with superior step coverage, since the element isolation insulating film 16 is present in the element isolation regions 14 under the select gate electrodes.

Next, as shown in FIGS. 15A to 15D, the inter-layer insulating film 48 is formed on the etching stopper film 46 to fill between the two select gate electrodes. The inter-layer insulating film 48 is, for example, a BPSG film formed by the LPCVD method. After that, the inter-layer insulating film 48 is flattened out by the CMP method. The material selected for the inter-layer insulating film 48 would have the etching rate greater than that of the etching stopper film 46 when dry etching at a later stage.

Moreover, an inter-layer insulating film 80 is formed on the inter-layer insulating film 48. The inter-layer insulating film 80 is, for example, the plasma TEOS film or the plasma $SiH_4$ film formed by the plasma CVD method.

Then, as shown in FIGS. 16A to 16D, a resist pattern 66 is formed in the way that the space between the two select gate electrodes is opened, and etching is performed by using the resist pattern 66 as the mask. By this etching, the inter-layer insulating film 80 and the inter-layer insulating film 48 are removed with the etching stopper film 46 as the etching stopper.

This etching is performed by means of dry etching such as the RIE method. This dry etching adopts a condition in which the etching selectivity ratio for the etching stopper film 46 is high.

In this way, the etching amount of the inter-layer insulating film 80 and the inter-layer insulating film 48 can be sufficiently secured by using the etching stopper film 46 as the etching stopper. As a result, stable contact holes with wide process margins can be formed.

Next, etching is performed as shown in FIGS. 17A to 17D, and contact holes 78 are formed by removing the etching stopper film 46. This etching is performed by means of dry etching such as the RIE method.

After that, the resist pattern 66 is removed, metal plugs are formed in the contact holes, and the source line contacts CS are formed as shown in FIGS. 1A to 1D. For example, a titanium nitride (TiN) film to be a barrier metal is deposited by the CVD method and, subsequently, the tungsten (W) film is deposited by the CVD method. Thereafter, the metal plugs are formed by removing the films outside the contact holes 78 by the CMP method.

After that, the upper layer electrode wiring and the like are formed by adopting a known process technique to form the non-volatile semiconductor memory device.

According to the method of manufacturing a non-volatile semiconductor device of the present embodiment above, the manufacturing method can be provided in which the air gaps in the element isolation regions and between the gate electrodes can be formed, and the process margin in the process for forming the electrical contacts can be secured.

The pattern of the contact holes has been described with the circular pattern shown in FIG. 3 as an example. However, the pattern of the contact holes is not limited to a circle. For example, the pattern may have a rectangular shape continuously opened along the row direction (the second direction) between the two select gate electrodes. The pattern may also have an elliptical or an oblong shape.

Moreover, for example, the regions of the select gate transistors STS in which the source line contacts CS are formed have been described in the embodiment. However, the same manufacturing method can be applied to the regions of the select gate transistors SGD in which the bit line contacts are formed.

Furthermore, the side walls of the select gate electrodes have been described with carbon as the material thereof as an example in the present embodiment. However, the side walls may also be polycrystalline or amorphous silicon. The polycrystalline or amorphous silicon side walls are formed by the LPCVD method and the RIE method, for example. In this case, the silicon side walls are desirably removed with choline or the like which can have a high etching selectivity ratio with respect to the element isolation insulating film such as the silicon oxide film. When applying the silicon side walls, it is desirable that an insulating film such as the silicon oxide film be formed between the silicon side walls and the select gate electrodes, as an etching protection film for the gate electrode material when removing the silicon side walls.

Additionally, the side walls may be of tungsten material, for example. The tungsten side walls are formed by the LPCVD method and the RIE method, for example. In this case, the tungsten side walls are desirably removed with a hydrogen peroxide solution or the like which can have a high etching selectivity ratio with respect to the element isolation insulating film such as the silicon oxide film. When applying the tungsten side walls, it is desirable that the insulating film such as the silicon oxide film be formed between the tungsten side walls and the select gate electrodes, as the etching protection film for the gate electrode material when removing the tungsten side walls.

While certain embodiments have been described, these embodiments have been presented by way of example only, and are not intended to limit the scope of the inventions. Indeed, the method of manufacturing a non-volatile semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method of manufacturing a non-volatile semiconductor memory device, comprising:
   forming, on a semiconductor substrate, a plurality of element regions extended in a first direction and arranged in parallel with each other, and an element isolation region mutually isolates the element regions and filled with a first insulating film;

forming, on the element regions, a plurality of memory cell gate electrodes extends in a second direction orthogonal to the first direction and arranged in parallel with each other;

etching the first insulating film, after forming the memory cell gate electrodes, in such a manner that the first insulating film remains in at least the element isolation region of a region where select gate electrodes are to be formed;

forming a second insulating film on the memory cell gate electrodes having a gap between the memory cell gate electrodes;

forming two select gate electrodes extends in the second direction and arranged side by side in parallel with each other, on the element regions of the region where the select gate electrodes are to be formed;

forming carbon side walls on opposing side surfaces of the select gate electrodes;

implanting impurity ions into the element regions between the two select gate electrodes with the carbon side walls as a mask; and removing the carbon side walls.

2. The method according to claim 1, wherein the carbon side walls are removed by ashing.

3. The method according to claim 1, wherein the air gap passing through the first insulating film under the memory cell gate electrodes is formed when etching the first insulating film.

4. The method according to claim 1, wherein,
when forming the plurality of memory cell gate electrodes, an electrode pattern is formed in the region where select gate electrodes are to be formed, the electrode pattern having a width equivalent to a sum of two select gate electrodes formed later and a space therebetween, and the electrode pattern is patterned.

5. The method according to claim 1, wherein the first insulating film is a silicon oxide film, an etching rate of the first insulating film with a hydrofluoric acid is greater than that of a thermal silicon oxide film.

6. The method according to claim 1, wherein the first insulating film is formed by SOG method.

7. The method according to claim 1, wherein the first insulating film is a polysilazane film.

8. The method according to claim 1, wherein the first insulating film is etched with a dilute hydrofluoric acid.

9. The method according to claim 1, wherein the second insulating film is formed by a plasma CVD method.

10. The method according to claim 1, wherein the carbon side walls are formed by deposition of a carbon film by a CVD method and successive etching by an RIE method.

11. The method according to claim 1, wherein the impurity ions are arsenic.

12. The method according to claim 1, further comprising:
forming an etching stopper film on the element regions between the two select gate electrodes after removing the carbon side walls;
forming an inter-layer insulating film on the etching stopper film; and
forming a contact hole by removing the inter-layer insulating film between the two select gate electrodes by means of dry etching,
wherein an etching rate of the inter-layer insulating film is greater than an etching rate of the etching stopper film in the dry etching.

13. The method according to claim 12, wherein the etching stopper film is a silicon nitride film.

14. The method according to claim 13, wherein the silicon nitride film is formed by an LPCVD method.

15. The method according to claim 12, wherein the inter-layer insulating film is a plasma TEOS film or a plasma $SiH_4$ film.

16. The method according to claim 12, wherein the contact hole has a pattern that is open in a rectangular shape across the plurality of element regions in the second direction.

17. A method of manufacturing a non-volatile semiconductor memory device, comprising:
forming, on a semiconductor substrate, a plurality of element regions extended in a first direction and arranged in parallel with each other, and an element isolation region mutually isolates the element regions and filled with a first insulating film;

forming, on the element regions, a plurality of memory cell gate electrodes extends in a second direction orthogonal to the first direction and arranged in parallel with each other;

etching the first insulating film, after forming the memory cell gate electrodes, in such a manner that the first insulating film remains in at least the element isolation region of a region where select gate electrodes are to be formed;

forming a second insulating film on the memory cell gate electrodes having a gap between the memory cell gate electrodes;

forming two select gate electrodes extends in the second direction and arranged side by side in parallel with each other, on the element regions of the region where the select gate electrodes are to be formed;

forming polycrystalline or amorphous silicon side walls on opposing side surfaces of the select gate electrodes;

implanting impurity ions into the element regions between the two select gate electrodes with the silicon side walls as a mask; and removing the silicon side walls.

18. The method according to claim 17, further comprising forming an insulating film of a silicon oxide film on the two select gate electrodes before forming the silicon side walls.

19. A method of manufacturing a non-volatile semiconductor memory device, comprising:
forming, on a semiconductor substrate, a plurality of element regions extended in a first direction and arranged in parallel with each other, and an element isolation region mutually isolates the element regions and filled with a first insulating film;

forming, on the element regions, a plurality of memory cell gate electrodes extends in a second direction orthogonal to the first direction and arranged in parallel with each other;

etching the first insulating film, after forming the memory cell gate electrodes, in such a manner that the first insulating film remains in at least the element isolation region of a region in where select gate electrodes are to be formed;

forming a second insulating film on the memory cell gate electrodes having a gap between the memory cell gate electrodes;

forming two select gate electrodes extends in the second direction and arranged side by side in parallel with each other, on the element regions of the region where the select gate electrodes are to be formed;

forming tungsten side walls on opposing side surfaces of the select gate electrodes;

implanting impurity ions into the element regions between the two select gate electrodes with the tungsten side walls as a mask; and removing the tungsten side walls.

20. The method according to claim 19, further comprising forming an insulating film of a silicon oxide film on the two select gate electrodes before forming the tungsten side walls.

\* \* \* \* \*